US012347522B2

(12) United States Patent
Chadwick, Jr.

(10) Patent No.: US 12,347,522 B2
(45) Date of Patent: Jul. 1, 2025

(54) ON-CHIP AUTOMATION OF CLOCK-TO-Q ACCESS TIME MEASUREMENT OF A MEMORY DEVICE

(71) Applicant: Synopsys, Inc., Mountain View, CA (US)

(72) Inventor: Thomas B. Chadwick, Jr., Essex Junction, VT (US)

(73) Assignee: SYNOPSYS, INC., Sunnyvale, CA (US)

( * ) Notice: Subject to any disclaimer, the term of this patent is extended or adjusted under 35 U.S.C. 154(b) by 212 days.

(21) Appl. No.: 18/306,584

(22) Filed: Apr. 25, 2023

(65) Prior Publication Data
US 2023/0352069 A1   Nov. 2, 2023

Related U.S. Application Data

(60) Provisional application No. 63/335,483, filed on Apr. 27, 2022.

(51) Int. Cl.
*G11C 7/22* (2006.01)
*G06F 12/06* (2006.01)

(52) U.S. Cl.
CPC ............ *G11C 7/222* (2013.01); *G06F 12/06* (2013.01); *G11C 2207/2254* (2013.01)

(58) Field of Classification Search
CPC ............ G11C 7/222; G11C 2207/2254; G11C 29/50012; G11C 7/1066; G06F 12/06
USPC ......................................... 365/230.06, 233.1
See application file for complete search history.

(56) References Cited

U.S. PATENT DOCUMENTS

| | | | | |
|---|---|---|---|---|
| 3,961,267 A | * | 6/1976 | Weissmueller, Jr. | H03J 5/0236 455/166.1 |
| 4,392,105 A | | 7/1983 | McLeod | |
| 4,615,040 A | * | 9/1986 | Mojoli | H04L 27/2602 375/267 |
| 5,229,970 A | * | 7/1993 | Lee | G11C 11/406 365/194 |
| 5,559,465 A | * | 9/1996 | Shah | H03K 17/04206 327/374 |
| 6,323,713 B1 | * | 11/2001 | Yuzue | G06F 1/08 327/119 |
| 2003/0093702 A1 | * | 5/2003 | Luo | G06F 1/32 713/320 |
| 2003/0132741 A1 | * | 7/2003 | Senthilkumar | H03B 5/364 331/158 |
| 2003/0191977 A1 | * | 10/2003 | Ziesler | G06F 1/04 713/320 |
| 2004/0160839 A1 | * | 8/2004 | Kim | G11C 11/406 365/222 |
| 2007/0297253 A1 | * | 12/2007 | Turgis | G11C 29/50012 365/201 |
| 2009/0144677 A1 | * | 6/2009 | Gonzalez | G11C 29/54 716/106 |
| 2009/0245010 A1 | * | 10/2009 | Searles | G06F 13/1689 365/230.06 |

(Continued)

*Primary Examiner* — Michael T Tran
(74) *Attorney, Agent, or Firm* — Park, Vaughan, Fleming & Dowler LLP; Laxman Sahasrabuddhe (57) ABSTRACT

An integrated circuit (IC) may include a memory device and a circuit coupled with the memory device. The circuit may precondition the memory device to sustain oscillations, initiate first oscillations in a first loop that includes the memory device, and initiate second oscillations in a second loop that does not include the memory device.

20 Claims, 9 Drawing Sheets

(56) References Cited

U.S. PATENT DOCUMENTS

| | | | |
|---|---|---|---|
| 2009/0261999 A1* | 10/2009 | Ramaswami | H03M 1/1095 |
| | | | 341/120 |
| 2010/0102890 A1* | 4/2010 | Stratz | G11C 29/50012 |
| | | | 331/44 |
| 2011/0310659 A1* | 12/2011 | Seol | G11C 7/222 |
| | | | 331/108 R |
| 2014/0070784 A1* | 3/2014 | Lynch | H02M 3/156 |
| | | | 323/283 |
| 2017/0199089 A1* | 7/2017 | Fritchman | G01K 15/005 |
| 2017/0243627 A1* | 8/2017 | Mansuri | G06F 13/4234 |
| 2018/0006605 A1* | 1/2018 | Kumar | H03B 5/04 |
| 2022/0261032 A1* | 8/2022 | Bateni | G06F 1/12 |
| 2022/0347715 A1* | 11/2022 | Estelle | G05B 11/42 |

* cited by examiner

ON-CHIP AUTOMATION OF CLOCK-TO-Q ACCESS TIME MEASUREMENT OF A MEMORY DEVICE

RELATED APPLICATION

This application claims the benefit of U.S. Provisional Application Ser. No. 63/335,483, filed on 27 Apr. 2022, the contents of which are herein incorporated by reference in their entirety for all purposes.

TECHNICAL FIELD

The present disclosure relates to integrated circuits (ICs). More specifically, the present disclosure relates to on-chip automation of clock-to-Q access time measurement of a memory device.

BACKGROUND

Computer systems may store information in memory devices. The performance of a computer system may depend on the access time of a memory device, e.g., the amount of time used for writing to and/or reading from the memory device. It is important to accurately measure the access time of memory devices.

SUMMARY

An integrated circuit (IC) may include a memory device and a circuit coupled with the memory device. The circuit may precondition the memory device to sustain oscillations, initiate first oscillations in a first loop that includes the memory device, and initiate second oscillations in a second loop that does not include the memory device.

In some embodiments described herein, the circuit may include a set of multiplexers, where a set of outputs of the set of multiplexers may be coupled with a set of inputs of the memory device. The circuit may include a finite state machine (FSM) which provides a set of select signals to the set of multiplexers, where the memory device and the FSM are clocked using a clock signal.

In some embodiments described herein, the FSM may include a first state in which the FSM writes a first value to a first memory address, where the FSM transitions from an idle state to the first state when an enable signal is asserted. The FSM may include a second state in which the FSM writes a second value to a second memory address, where the second value is a complement of the first value (e.g., the first value may be a logic 0 and the second value may be a logic 1), and where the FSM transitions from the first state to the second state after one clock cycle of the clock signal.

In some embodiments described herein, the FSM may include a third state in which the FSM reads the first value from the first memory address, where the FSM transitions from the second state to the third state after one clock cycle of the clock signal.

In some embodiments described herein, the FSM may include a fourth state in which the FSM reads the second value from the second memory address, where the FSM transitions from the third state to the fourth state after one clock cycle of the clock signal.

In some embodiments described herein, the FSM may include a fifth state in which the FSM provides an oscillating signal to a clock input of the memory device, where the oscillating signal corresponds to the first oscillations or the second oscillations, and where the FSM transitions from the fourth state to the fifth state after one clock cycle of the clock signal.

In some embodiments described herein, the FSM may transition from the fifth state to the idle state when the enable signal is deasserted.

In some embodiments described herein, the circuit may initiate either the first oscillations or the second oscillations based on a calibration signal.

In some embodiments described herein, the circuit may include a clock divider, where an oscillating signal corresponding to the first oscillations or the second oscillations may be provided as an input to the clock divider, and an output of the clock divider may be provided as an output of the circuit.

In some embodiments described herein, a first cycle time of the first oscillations may be measured. A second cycle time of the second oscillations may be measured. A clock-to-Q access time of the memory device may be computed based on the first cycle time and the second cycle time.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Aspects of the present disclosure relate to on-chip automation of clock-to-Q access time measurement of a memory device. A technique called the "McLeod Loop" may be used to measure the clock-to-Q access time of a synchronous memory device. The term "clock-to-Q" refers to the duration between a clock transition in a clock signal provided to a memory device and the data being available at the data pin of the memory device.

These measurements may require the memory device to be properly preconditioned via writes and reads to enable a free-running oscillation. The preconditioning requirements of the memory device under test can vary from one device to another, and can be difficult to properly configure, setup, and execute via tester-driven chip pins.

Some embodiments described herein provide a technique for measuring the clock-to-Q access time of a synchronous memory device that may be controlled by a tester by way of 2 low-frequency signals, e.g., a "Calibrate" signal and an "Enable" signal. Specifically, in response to the assertion of the "Enable" signal, on-chip logic in some embodiments described herein may configure the memory device under test and other McLeod Loop specific on-chip logic over a number of cycles resulting in a free-running oscillation.

Technical advantages of embodiments described herein include, but are not limited to, (1) removing the complexity of setting up and triggering the McLeod Loop oscillation from the tester itself, and (2) providing on-chip logic for setting up and triggering the McLeod Loop oscillation with little disruption to the normal operation of the memory device, and with low logic overhead.

Figure 1:
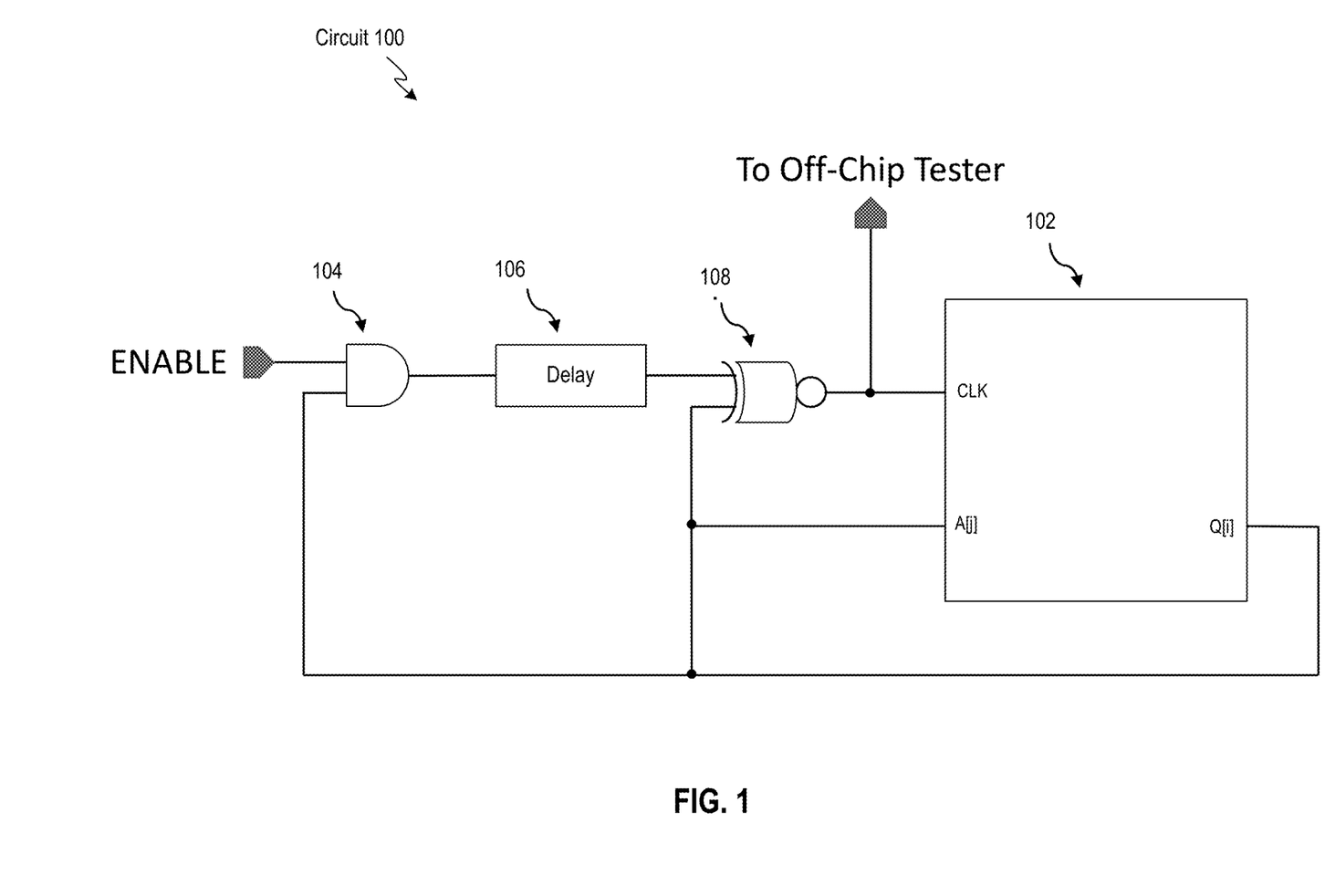
FIG. 1 illustrates a McLeod Loop.

FIG. 1 illustrates a McLeod Loop. A McLeod Loop exploits an inverting address-to-Q path through a synchronous memory device to generate a clock pulse and a new address each time the Q output of the memory device switches. The result is a free-running oscillation that can be buffered to a chip output pin where its frequency can be measured by an off-chip tester. Circuit 100, which implements a McLeop Loop, may comprise memory device 102, AND gate 104, delay element 106, and exclusive NOR gate 108. For the sake of simplicity of the diagram, additional inputs to the memory such as read/write control signals, data input, and additional address input pins are not shown in FIG. 1.

The McLeod loop may operate as follows. Assume that the memory has been previously written such that when the memory is read with input A[j] at a logic 0, memory output Q[i] will output a logic 1 and when the memory is read with input A[j] at a logic 1, memory output Q[i] will output a logic 0. To establish an initial steady state the ENABLE signal may be externally held at a logic 0. Via a previous read, memory device 102 output Q[i] is at a logic 1. Thus, the output of AND gate 104 is a logic 0, the output of delay element 106 is a logic 0, the output of exclusive NOR gate 108 is a logic 0, memory device 102 input CLK is a logic 0, and memory device 102 input A[j] is a logic 1.

Now, if the ENABLE signal is asserted to a logic 1 then the output of AND gate 104 will transition to a logic 1, the output of delay element 106 will transition to a logic 1, the output of exclusive NOR gate 108 will transition to a logic 1, and the CLK input to memory device 102 will transition to a 1. This rising edge of the CLK input will trigger a read of memory device 102 and, after a clock-to-Q delay intrinsic to memory device 102, output Q[i] will transition to a logic 0, as will memory input A[j]. With the output of delay element 106 remaining at a logic 1, the output of exclusive NOR gate 108 will transition to a logic 0. After a time, the output of delay element 106 will transition to a logic 0 resulting in the output of exclusive NOR gate 108 transitioning to a logic 1, as will memory device 102 input CLK. This rising edge of the CLK input will trigger another read of memory device 102. Hereafter, the loop may enter a sustained oscillation of the CLK, A[j] and Q[i] pins of memory device 102 as long as ENABLE is held at a logic 1.

Figure 2:
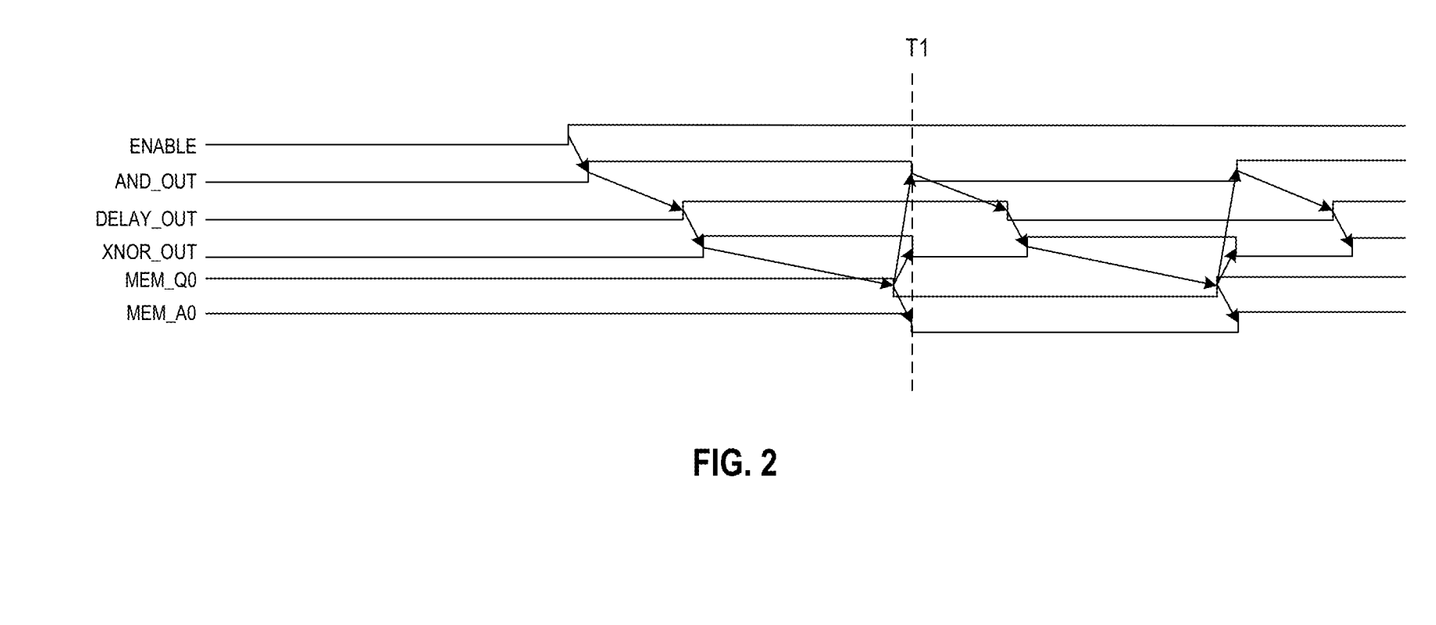
FIG. 2 illustrates a waveform generated by a McLeod Loop.

FIG. 2 illustrates a waveform generated by a McLeod Loop. The waveforms for the ENABLE signal (shown as "ENABLE"), the output of AND gate 104 (shown as "AND_OUT"), the output of delay element 106 (shown as "DELAY_OUT"), output of exclusive NOR gate 108 (shown as "XNOR_OUT") which is also the clock input of memory device 102, the Q0 output (shown as "MEM_Q0") of the memory device 102, and the address A0 (shown as "MEM_A0") of the memory device 102 are shown. After time T1, a sustained oscillation of the CLK, A[j] and Q[i] pins of memory device 102 is shown. The arrows illustrate the causation between different signal transitions. For example, at time T1, the transition in the AND_OUT causes a corresponding transition in DELAY_OUT, which causes a corresponding transition in the XNOR_OUT, and so forth.

The oscillation at the CLK pin of memory device 102 may be buffered to an off-chip pin where its cycle time can be measured by an off-chip tester. The cycle time of the oscillation may be equal to the sum of delays through memory device 102, AND gate 104, delay element 106, and exclusive NOR gate 108. However, the objective is to measure the clock-to-Q delay of memory device 102, which is only a portion of the cycle time of the oscillation. To extract the clock-to-Q delay of memory device 102, the circuit shown in FIG. 1 may be modified, as shown in FIG. 3.

Figure 3:
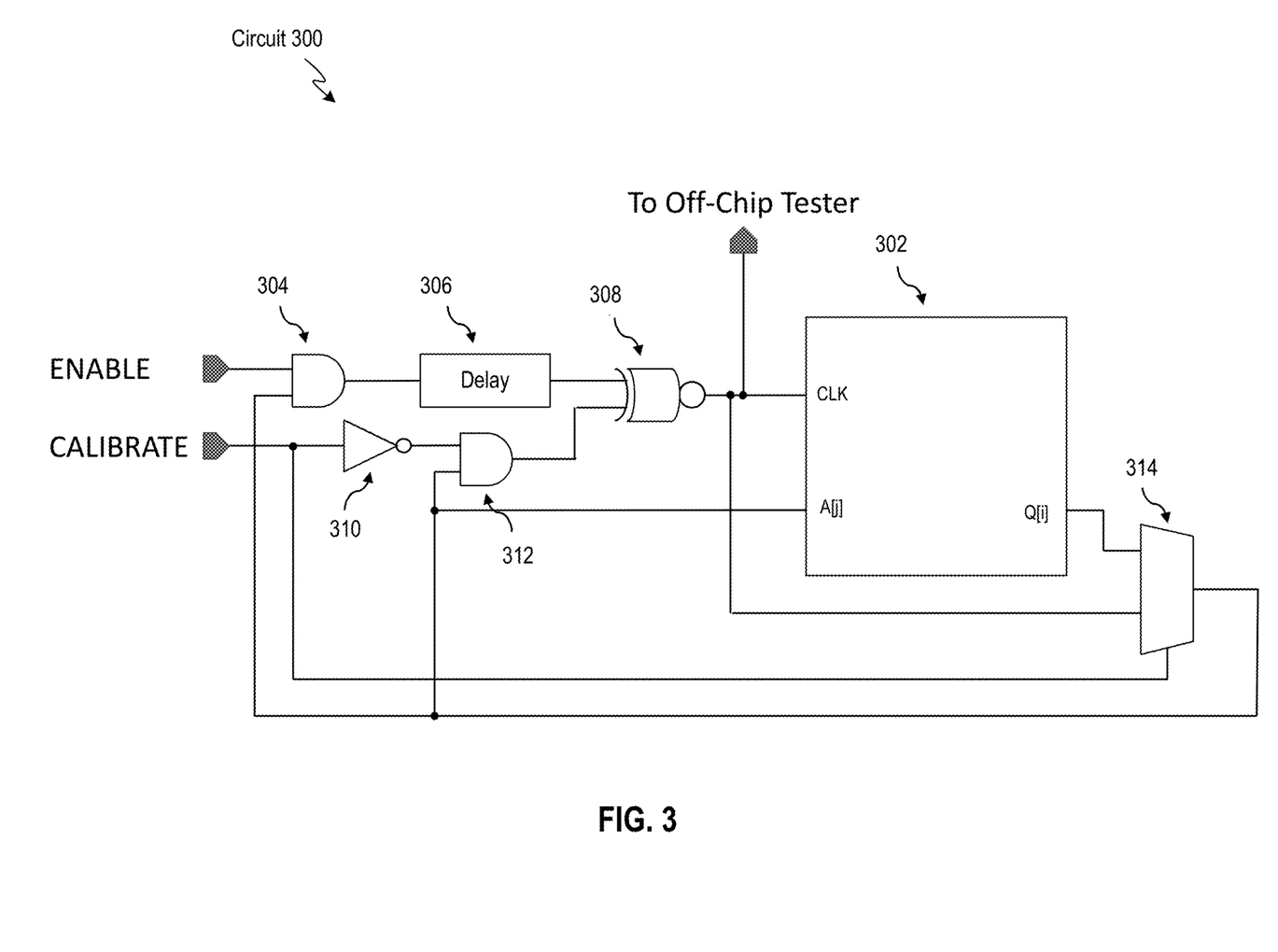
FIG. 3 illustrates a McLeod Loop with a calibration circuit.

FIG. 3 illustrates a McLeod Loop with a calibration circuit. The McLeod Loop in circuit 300 may comprise memory device 302, AND gate 304, delay element 306, and exclusive NOR gate 308. The calibration logic in circuit 300 may comprise the CALIBRATE signal, inverter 310, AND gate 312, and multiplexor 314. The CALIBRATE signal may be provided to the select input of multiplexor 314, such that when CALIBRATE is at a logic 0, output Q[i] of memory device 302 is outputted by multiplexor 314, and when CALIBRATE is at a logic 1, the CLK input signal of memory device 302 (which is the output of exclusive NOR gate 308) is outputted by multiplexor 314.

If CALIBRATE is held at a logic 0, then the operation of circuit 300 may be identical to the operation of circuit 100 shown in FIG. 1. However, the loop delay may be slightly different because circuit 300 includes multiplexor 314 in the loop. Thus, the cycle time of the oscillation in circuit 300 may be equal to the sum of the delays through memory device 302, AND gate 304, delay element 306, exclusive NOR gate 308, and multiplexor 314.

If CALIBRATE is held to a logic 1, then the operation of circuit 300 may be different than circuit 100 shown in FIG. 1. Specifically, if CALIBRATE is held to a logic 1, an oscillating logic loop is created that propagates through AND gate 304, delay element 306, exclusive NOR gate 308, and multiplexor 314. When CALIBRATE is held at a static value, the outputs of inverter 310 and AND gate 312 also remain static. Thus, these circuit elements do not contribute to the propagation delay of the loop. The cycle time of this oscillating loop, as measured off-chip, may be twice the sum of delays through circuit elements AND gate 304, delay element 306, exclusive NOR gate 308, and multiplexor 314.

Therefore, by measuring the cycle times of the two different oscillations produced when CALIBRATE is held at a logic 0 vs. when CALIBRATE is held at a logic 1, the clock-to-Q access time of memory device 302 may be calculated using the following expression: $t\_acc = t\_cyc0 - t\_cyc1/2$, where $t\_acc$ is the access time, $t\_cyc0$ is the measured cycle time of the oscillation when CALIBRATE is held to a logic 0, and $t\_cyc1$ is the measured cycle time of the oscillation when CALIBRATE is held to a logic 1.

An off-chip tester may be used to test different memory devices, where each memory device may use different processes to initiate oscillations and measure clock-to-Q access time. Thus, in these approaches, the off-chip tester may implement complex logic that may be difficult to debug and maintain.

Figure 4:
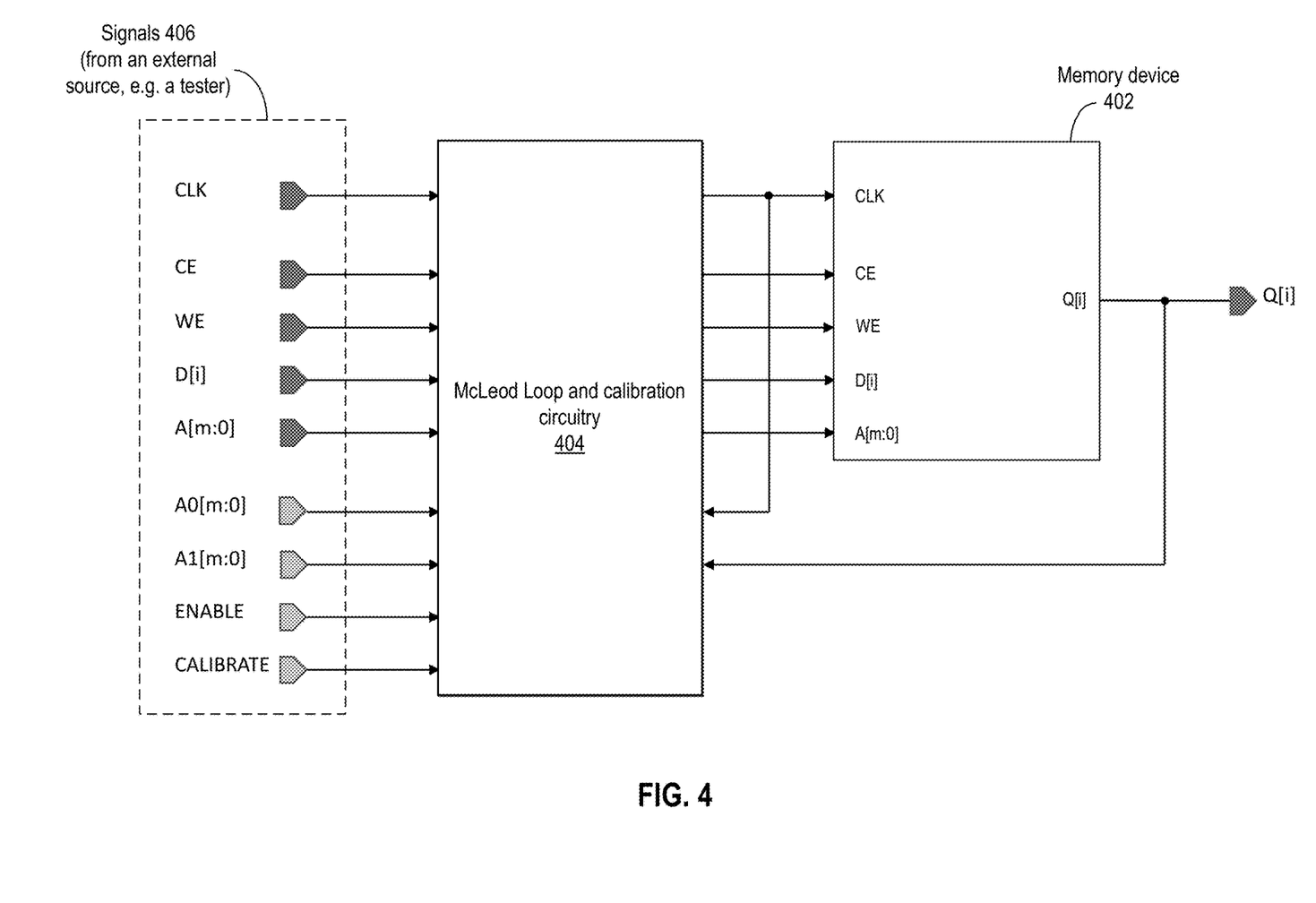
FIG. 4 illustrates an IC that includes McLeod-Loop-and-calibration-circuitry and a memory device in accordance with some embodiments described herein.

FIG. 4 illustrates an IC that includes McLeod Loop and calibration circuitry and a memory device in accordance with some embodiments described herein.

Memory device 402 and McLeod Loop and calibration circuitry 404 may be implemented on the same IC chip. McLeod Loop and calibration circuitry 404 may receive signals 406 from an external source, e.g., a tester. McLeod Loop and calibration circuitry 404 may precondition memory device 402 and initiate oscillations which, when measured, may be used to determine the clock-to-Q access time of memory device 402. Embodiments described herein may use McLeod Loop and calibration circuitry 404 to relieve the off-chip tester from handling the complexity of preconditioning a memory device to start oscillations in the McLeod Loop.

Signal CLK may be a clock signal that may be provided to the memory device 402 and may be used to time read and write requests. Signal CE may be a chip enable signal which may allow a system to select memory device 402. Signal WE may be a write enable signal which may indicate to memory device 402 that a write operation is being performed. Signal D[i] may contain a data bit which is to be written to the memory device 402 during a write operation. Set of address signals A[m:0] may specify a memory address corresponding to the read or write operation. Signal Q[i] may be the data bit read out from the memory device 402 corresponding to the memory address A[m:0] provided as input to memory device 402.

In some embodiments described herein, signals 406 may include signals A0[m:0], A1[m:0], ENABLE, and CALIBRATE. Set of address signals A0[m:0] and A1[m:0] may be used to precondition memory device 402. The ENABLE signal may be used to instruct McLeod Loop and calibration circuitry 404 to precondition memory device 402 and initiate oscillations. The CALIBRATE signal may be used to instruct McLeod Loop and calibration circuitry 404 to include (or not include) memory device 402 in the oscillation loop. In embodiments described herein, complex operations to precondition the memory device and initiate oscillations may be performed by McLeod Loop and calibration circuitry 404 which is part of an IC that includes the memory device 402.

Figure 5:
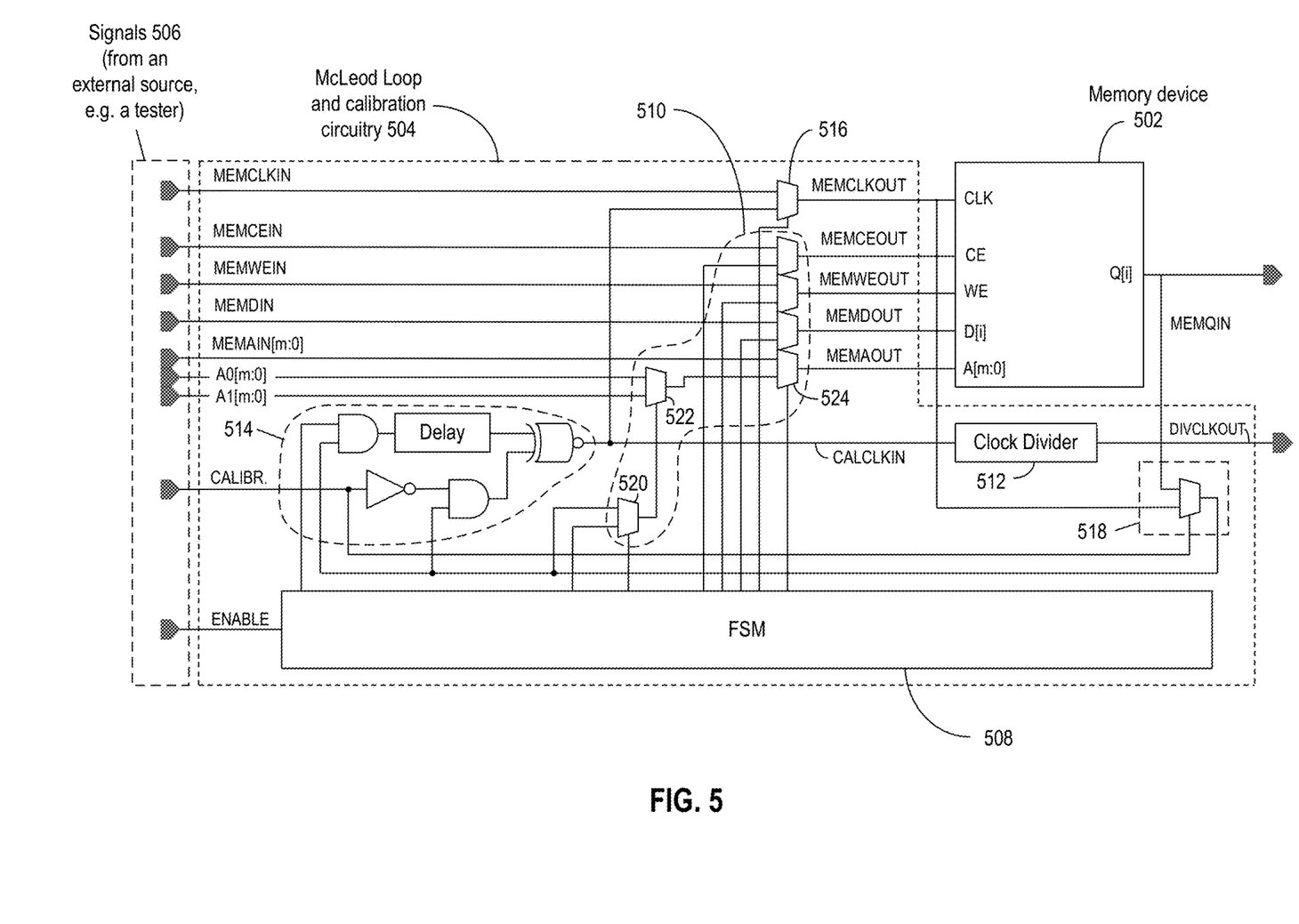
FIG. 5 illustrates an implementation of McLeod-Loop-and-calibration-circuitry in accordance with some embodiments described herein.

FIG. 5 illustrates an implementation of McLeod Loop and calibration circuitry in accordance with some embodiments described herein.

The inputs CLK, CE, WE, D[i], and A[m:0] of memory device 502 may be multiplexed between the signals 506 (which may be received from an external source, e.g., a tester) and corresponding signals generated by McLeod Loop and calibration circuitry 504. Embodiments described herein may precondition memory device 502 using write and read operations and then start oscillations in the McLeod Loop. Specifically, finite state machine (FSM) 508 may perform the cycle-by-cycle sequence of events that are used to precondition memory device 502 and initiate the McLeod Loop oscillation. FSM 508 may receive clock signal MEMCLKIN, which may be used by FSM 508 for transitioning between different states (a connection from MEMCLKIN to FSM 508 is not shown in FIG. 5).

Circuitry 514 may correspond to the circuitry shown in FIG. 3 which includes AND gate 304, delay element 306, exclusive NOR gate 308, inverter 310, and AND gate 312. Multiplexer 518 may correspond to multiplexer 314 in FIG. 3. Multiplexer 518 may receive the MEMCLKOUT signal at the bottom input and the MEMQIN signal (which is the Q[i] output of memory device 502) at the top input. The operation of circuitry 514 and multiplexer 518 may correspond to the operation of the circuitry shown in FIG. 3. Specifically, when the CALIBRATE signal (which may be provided as a select signal to multiplexer 518) is held at a logic 0, an oscillation loop may be created which passes through memory device 502 (e.g., by selecting the top input of multiplexer 518 to be the output), and when the CALIBRATE signal is held at a logic 1, an oscillation loop may be created which bypasses memory device 502 (e.g., by selecting the bottom input of multiplexer 518 to be the output). The cycle time of the oscillation loop may be twice the sum of delays through the circuit elements. The clock-to-Q access time of memory device 502 may be calculated using the following expression: $t\_acc = t\_cyc0 - t\_cyc1/2$, where $t\_acc$ is the access time, $t\_cyc0$ is the measured cycle time of the oscillation when CALIBRATE is held to a logic 0, and $t\_cyc1$ is the measured cycle time of the oscillation when CALIBRATE is held to a logic 1.

FSM 508 may provide select input signals to multiplexers 510 and 516, which may enable FSM 508 to control the inputs that are provided to memory device 502. Specifically, FSM 508 may precondition memory device 502 and initiate oscillations based on the ENABLE signal. Clock divider 512 may generate a frequency divided version of the oscillation signal. The output of clock divider 512 may be used to calculate the clock-to-Q access time of memory device 502.

Signals 506 may include signals MEMCLKIN (which may be a clock signal), MEMCEIN (which may be a chip enable signal), MEMEWEIN (which may be a write enable signal), MEMDIN (which may be a data bit), and MEMAIN [m:0] (which may be a memory address). Signals 506 may also include signals A0[m:0] (which may be a first address for preconditioning memory device 502), A1[m:0] (which may be a second address for preconditioning memory device 502), CALIBRATE (shown as "CALIBR." in FIG. 5, which may specify which oscillation loop to activate), and ENABLE (which may be used to instruct McLeod Loop and calibration circuitry 504 to precondition and initiate oscillations).

FSM 508 may generate signals that correspond to signals MEMCLKIN, MEMCEIN, MEMEWEIN, and MEMDIN. Further, FSM 508 may generate select signals that multiplex between signals MEMCLKIN, MEMCEIN, MEMEWEIN, and MEMDIN and the corresponding signals generated by FSM 508. Specifically, some of the multiplexers in multiplexers 510 may be used for this purpose. The multiplexed output signals are shown as MEMCLKOUT, MEMCEOUT, MEMWEOUT, and MEMDOUT, which may be provided to the CLK, CE, WE, and D[i] pins of memory device 502.

The signal MEMAIN[m:0] may be multiplexed with signals A0[m:0] and A1[m:0], and the output (shown as MEMAOUT) may be provided to the address port A[m:0] of memory device 502. The select signals of the multiplexers may be generated by FSM 508. Specifically, the FSM may use multiplexer 522 to select between A0[m:0] and A1[m:0], and then use multiplexer 524 to select between MEMAIN [m:0] and the output of multiplexer 522. The output of multiplexer 520 may be provided as a select signal to multiplexer 522. FSM 508 may use multiplexers 520, 522, and 524 to precondition memory device 502 by writing a first logic value (e.g., "0") to a first memory address (e.g., memory address A0[m:0]), and a second logic value (e.g., "1") to a second memory address (e.g., memory address A1[m:0]). To initiate oscillations, FSM 508 may provide a select signal to multiplexer 520 so that the top input of multiplexer 520 is connected to the output of multiplexer 520. In this state, the output of multiplexer 520 (which is the select signal for multiplexer 522) may cause multiplexer 522 to switch between A0[m:0] and A1[m:0] in successive cycles, which may sustain the oscillations in the loop.

Figure 6:
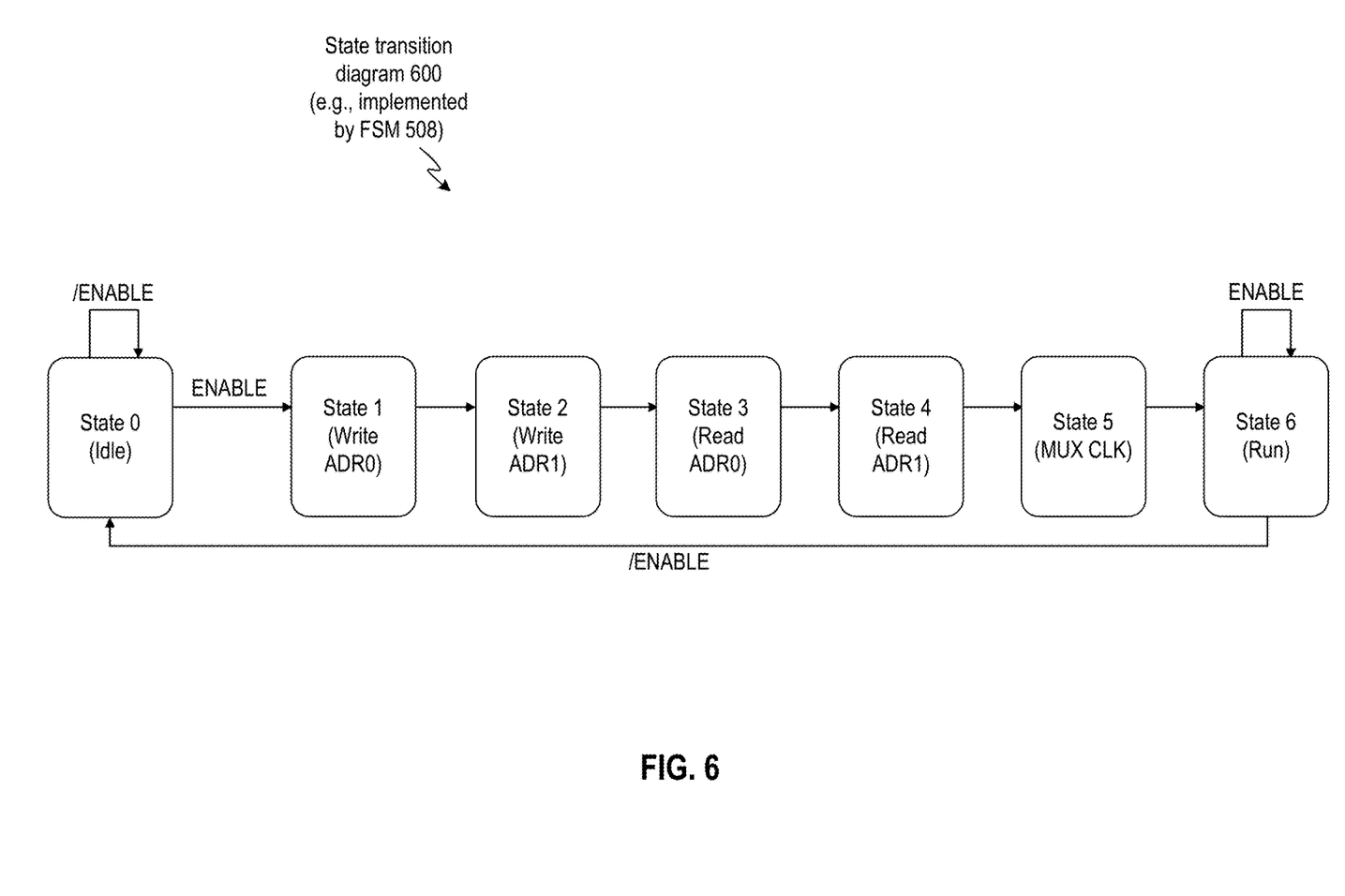
FIG. 6 illustrates a state transition diagram in accordance with some embodiments described herein.

FIG. 6 illustrates a state transition diagram in accordance with some embodiments described herein. State transition diagram 600 may be implemented by FSM 508.

State 0 may be the initial, default state. It may be entered when ENABLE is at logic 0. In FIG. 6, the notation "/ENABLE" indicates that the ENABLE signal is in logic 0, and the notation "ENABLE" indicates that the ENABLE signal is in logic 1. In this state, FSM 508 may control the select inputs of multiplexers 510 and 516 such that an off-chip tester (not shown in FIG. 5) is in control of the memory device, and the McLeod Loop is inoperative.

State 1 may be entered when ENABLE transitions high, i.e., ENABLE is asserted. FSM 508 may stay in State 1 for 1 clock cycle before unconditionally moving on to State 2. In state 1, FSM 508 may use multiplexers 510 to provide appropriate signals to input pins CE, WE, D[i], and A[m:0] of memory device 502 so that the proper data is written to address A0[m:0] of memory device 502. Specifically, CE may be asserted (which may cause memory device 502 to be selected) and WE may be asserted (which may cause memory device to write data to a specified memory location). Additionally, D[i] may be provided a logic 0 value and A[m:0] may be provided the address A0[m:0], which may cause memory device 502 to write the logic 0 value at address A0[m:0].

State 2 may be entered on the cycle after State 1. FSM 508 may stay in this state for 1 cycle before unconditionally moving on to State 3. In State 2, FSM 508 may use multiplexers 510 to provide appropriate signals to input pins CE, WE, D[i], and A[m:0] of memory device 502 so that the proper data is written to address A1[m:0] of memory device 502. Specifically, CE may be asserted (which may cause memory device 502 to be selected) and WE may be asserted (which may cause memory device to write data to a specified memory location). Additionally, D[i] may be provided a logic 1 value and A[m:0] may be provided the address A1[m:0], which may cause memory device 502 to write the logic 1 value at address A1[m:0].

State 3 may be entered on the cycle after State 2. FSM 508 may stay in this state for 1 cycle before unconditionally moving on to State 4. In State 3, FSM 508 may use multiplexers 510 to provide appropriate signals to input pins CE, WE, D[i], and A[m:0] of memory device 502 so that a read of address A0[m:0] is executed by memory device 502. Specifically, CE may be asserted (which may cause memory device 502 to be selected) and WE may be deasserted (which may cause memory device to read data from a specified memory location). Additionally, A[m:0] may be provided the address A0[m:0], which may cause memory device 502 to read the value from address A0[m:0] (e.g., logic 0 if that was the value which was written to this address in State 1) and output the value at the Q[i] output pin.

State 4 may be entered on the cycle after State 3. FSM 508 may stay in this state for 1 cycle before unconditionally moving on to State 5. In State 4, FSM 508 may use multiplexers 510 to provide appropriate signals to input pins CE, WE, D[i], and A[m:0] of memory device 502 so that a read of address A1[m:0] is executed by memory device 502. Specifically, CE may be asserted (which may cause memory device 502 to be selected) and WE may be deasserted (which may cause memory device to read data from a specified memory location). Additionally, A[m:0] may be provided the address A1[m:0], which may cause memory device 502 to read the value from address A1[m:0] (e.g., logic 1 if that was the value which was written to this address in State 2) and output the value at the Q[i] output pin.

State 5 may be entered on the cycle after State 4. FSM 508 may stay in this state for 1 cycle before unconditionally moving on to State 6. In State 5, FSM 508 may change the value of the select input to multiplexor 516 such the off-chip tester (not shown in FIG. 5) is no longer in control of the CLK input of memory device 502. Instead, the McLeod Loop logic is in control of the CLK input to the memory device 502. Specifically, the output from circuitry 514 may be provided as the CLK input to memory device 502 by using multiplexer 516.

State 6 may be entered on the cycle after State 5. FSM 508 may stay in this state until the ENABLE signal is de-asserted to a logic 0. In State 6, FSM 508 may assert the input to the AND gate which feeds the delay element in circuitry 514 to a logic 1 value, which may enable the McLeod Loop oscillation to commence. The off-chip tester may use the CALIBRATE signal to choose if the oscillation loop includes memory device 502 or not (as explained in reference to FIG. 3).

The oscillation signal is observable at the output of circuitry 514 (shown as "CALCLKIN" in FIG. 5). Clock divider 512 may be used to reduce the clock frequency of the oscillation signal. The output (shown as "DIVCLKOUT" in FIG. 5) of clock divider 512 may be provided as an output signal of McLeod Loop and calibration circuitry 504. The oscillation signal CALCLKIN or the output signal DIVCLKOUT may be used to measure cycle times of the two oscillations and compute the clock-to-Q access time.

Some embodiments described herein feature an IC which may include a memory device (e.g., memory device 502) and a circuit (e.g., McLeod Loop and calibration circuitry 504) coupled with the memory device. The circuit may precondition the memory device to sustain oscillations, initiate first oscillations in a first loop that includes the memory device, and initiate second oscillations in a second loop that does not include the memory device.

In some embodiments described herein, the circuit may include a set of multiplexers (e.g., multiplexers 510, 516, and 518), where a set of outputs of the set of multiplexers may be coupled with a set of inputs of the memory device. The circuit may include an FSM (e.g., FSM 508) which provides a set of select signals to the set of multiplexers, where the memory device and the FSM are clocked using a clock signal.

In some embodiments described herein, the circuit may initiate either the first oscillations or the second oscillations based on a calibration signal (e.g., signal "CALIBR." shown in FIG. 5). In some embodiments described herein, the circuit may include a clock divider (e.g., clock divider 512), where an oscillating signal (e.g., signal "CALCLKIN") corresponding to the first oscillations or the second oscillations may be provided as an input to the clock divider, and an output (e.g., "DIVCLKOUT") of the clock divider may be provided as an output of the circuit.

In some embodiments described herein, a first cycle time of the first oscillations may be measured. A second cycle time of the second oscillations may be measured. A clock-to-Q access time of the memory device may be computed based on the first cycle time and the second cycle time.

Figure 7:
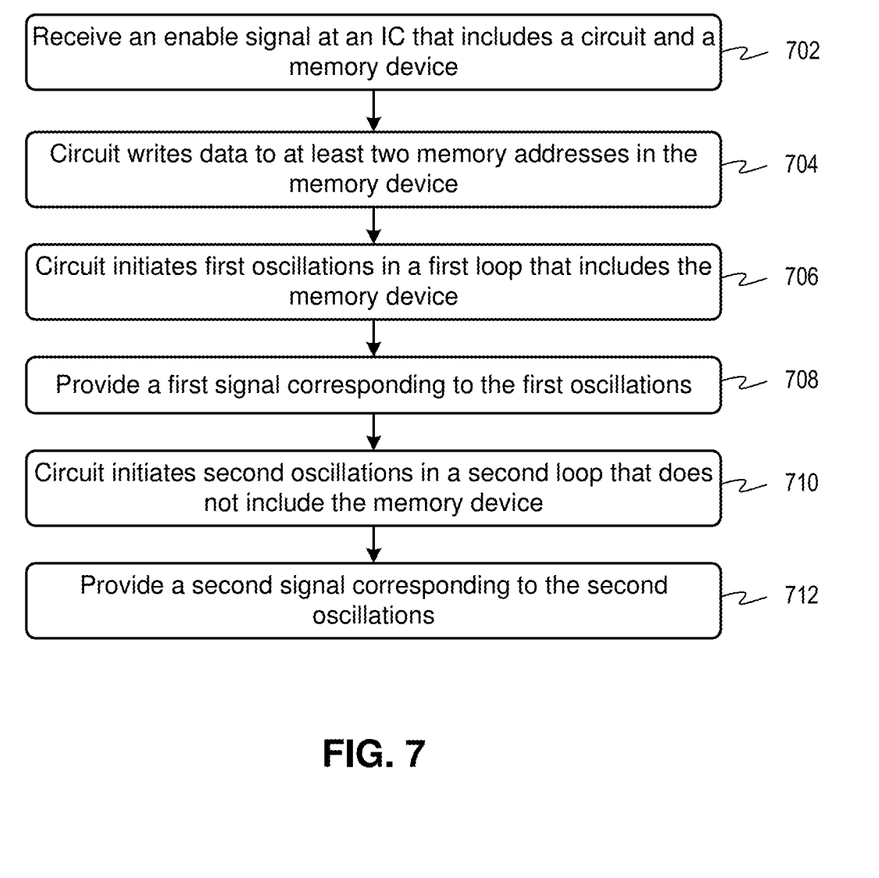
FIG. 7 illustrates a process for using on-chip circuitry to precondition a memory device and perform McLeod Loop oscillations in accordance with some embodiments described herein.

FIG. 7 illustrates a process for using on-chip circuitry to precondition a memory device and perform McLeod Loop oscillations in accordance with some embodiments described herein.

An enable signal may be received at an IC which includes a circuit and a memory device (at 702). Next, the circuit may write data to at least two memory addresses in the memory device (at 704). The circuit may initiate first oscillations in a first loop that includes the memory device (at 706). A first signal corresponding to the first oscillations may be provided (at 706). A first cycle time of the first oscillations may be measured (e.g., by an on-chip or off-chip measuring apparatus) based on the first signal corresponding to the first oscillations. The circuit may initiate second oscillations in a second loop that does not include the memory device (at 710). A second signal corresponding to the second oscillations may be provided (at 712). A second cycle time of the second oscillations may be measured (e.g., by an on-chip or off-chip measuring apparatus) based on the second signal corresponding to the second oscillations. A clock-to-Q access time of the memory device may be computed based on the first cycle time and the second cycle time.

Figure 8:
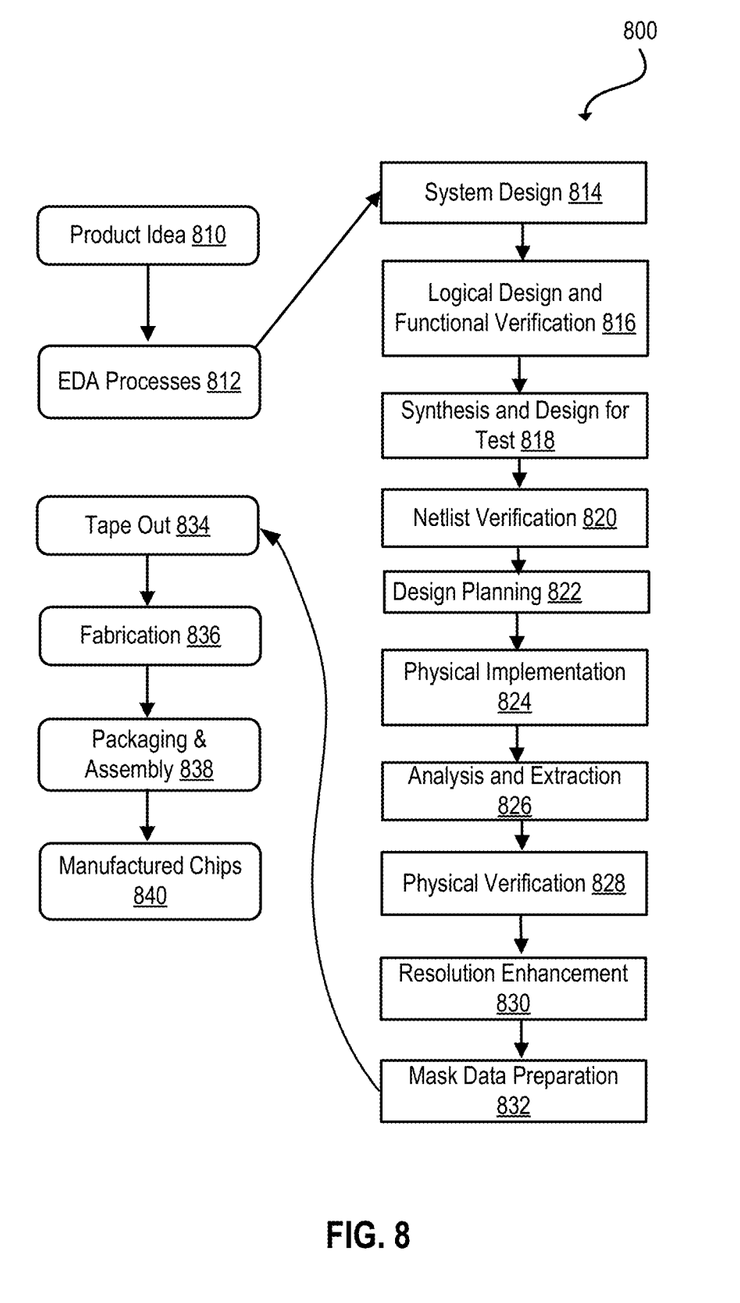
FIG. 8 illustrates an example flow for the design, verification, and fabrication of an integrated circuit in accordance with some embodiments described herein.

FIG. 8 illustrates an example flow 800 for the design, verification, and fabrication of an integrated circuit in accordance with some embodiments described herein. EDA processes 812 (the acronym "EDA" refers to "Electronic Design Automation") can be used to transform and verify design data and instructions that represent the integrated circuit. Each of these processes can be structured and enabled as multiple modules or operations.

Flow 800 can start with the creation of a product idea 810 with information supplied by a designer, information which is transformed and verified by using EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly 838 are performed to produce the manufactured IC chip 840.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
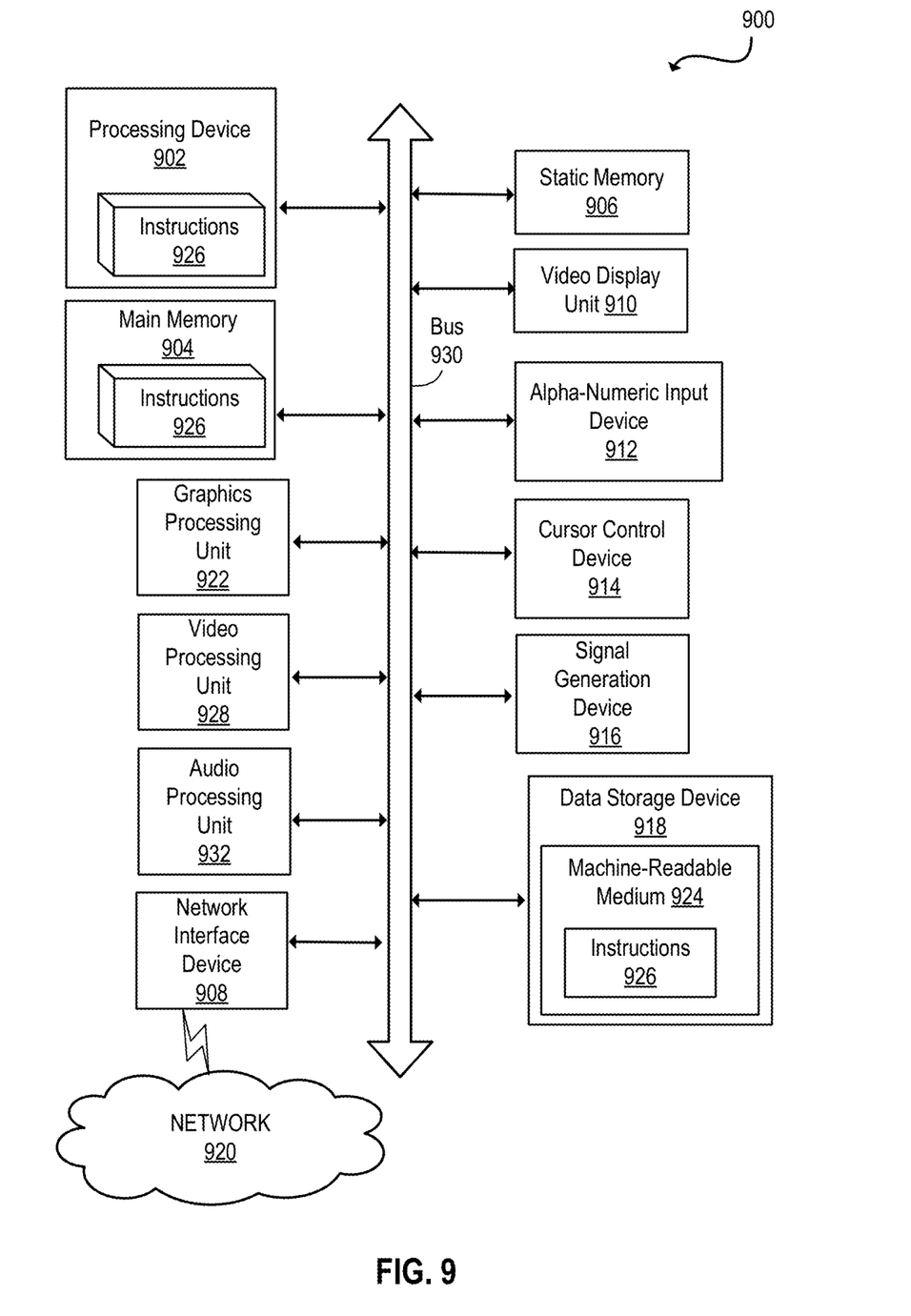
FIG. 9 illustrates an example machine of a computer system within which a set of instructions, for causing the machine to perform any one or more of the methodologies discussed herein, may be executed.

FIG. 9 illustrates an example machine of a computer system 900 within which a set of instructions, for causing the machine to perform any one or more of the methodologies discussed herein, may be executed. In alternative implementations, the machine may be connected (e.g., networked)

to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit (IC), comprising:
   a memory device; and
   a circuit coupled with the memory device and to:
      precondition the memory device to sustain oscillations;
      initiate first oscillations in a first loop that includes a data output pin of the memory device; and
      initiate second oscillations in a second loop that does not include the data output pin of the memory device.

2. The IC of claim 1, wherein the circuit comprises:
   a set of multiplexers, wherein a set of outputs of the set of multiplexers is coupled with a set of inputs of the memory device; and
   a finite state machine (FSM) which provides a set of select signals to the set of multiplexers, wherein the memory device and the FSM are clocked using a clock signal.

3. The IC of claim 2, wherein the FSM includes a first state in which the FSM writes a first value to a first memory address, wherein the FSM transitions from an idle state to the first state when an enable signal is asserted.

4. The IC of claim 3, wherein the FSM includes a second state in which the FSM writes a second value to a second memory address, wherein the second value is a complement of the first value, and wherein the FSM transitions from the first state to the second state after one clock cycle of the clock signal.

5. The IC of claim 4, wherein the FSM includes a third state in which the FSM reads the first value from the first memory address, wherein the FSM transitions from the second state to the third state after one clock cycle of the clock signal.

6. The IC of claim 5, wherein the FSM includes a fourth state in which the FSM reads the second value from the second memory address, wherein the FSM transitions from the third state to the fourth state after one clock cycle of the clock signal.

7. The IC of claim 6, wherein the FSM includes a fifth state in which the FSM provides an oscillating signal to a clock input of the memory device, wherein the oscillating signal corresponds to the first oscillations or the second oscillations, and wherein the FSM transitions from the fourth state to the fifth state after one clock cycle of the clock signal.

8. The IC of claim 7, wherein the FSM transitions from the fifth state to the idle state when the enable signal is deasserted.

9. The IC of claim 1, wherein the circuit initiates either the first oscillations or the second oscillations based on a calibration signal.

10. The IC of claim 1, wherein the circuit comprises a clock divider, wherein an oscillating signal corresponding to the first oscillations or the second oscillations is provided as an input to the clock divider, and wherein an output of the clock divider is provided as an output of the circuit.

11. A method, comprising:
    writing, by a circuit, data to at least two memory addresses in a memory device, wherein the circuit and the memory device are part of an integrated circuit (IC);
    initiating, by the circuit, first oscillations in a first loop that includes a data output pin of the memory device;
    generating, by the circuit, a first signal corresponding to the first oscillations;
    initiating, by the circuit, second oscillations in a second loop that does not include the data output pin of the memory device; and
    generating, by the circuit, a second signal corresponding to the second oscillations.

12. The method of claim 11, further comprising:
    measuring a first cycle time of the first oscillations based on the first signal;
    measuring a second cycle time of the second oscillations based on the second signal; and
    computing a clock-to-Q access time of the memory device based on the first cycle time and the second cycle time.

13. The method of claim 11, wherein the writing data to the at least two memory addresses in the memory device comprises writing a first value to a first memory address, and writing a second value to a second memory address.

14. The method of claim 13, wherein the second value is a complement of the first value.

15. The method of claim 13, wherein the first value and the second value are written in consecutive clock cycles.

16. An integrated circuit (IC), comprising:
    a memory device; and
    a circuit, comprising:
       a set of multiplexers, wherein a set of outputs of the set of multiplexers is coupled with a set of inputs of the memory device; and
       a finite state machine (FSM) which provides a set of select signals to the set of multiplexers, wherein the memory device and the FSM are clocked using a clock signal, and wherein the FSM preconditions the memory device to sustain oscillations, initiates first oscillations in a first loop that includes the memory device, and initiates second oscillations in a second loop that does not include the memory device.

17. The IC of claim 16, wherein the FSM includes a first state in which the FSM writes a first value to a first memory address, wherein the FSM transitions from an idle state to the first state when an enable signal is asserted, wherein the FSM includes a second state in which the FSM writes a second value to a second memory address, wherein the second value is a complement of the first value, and wherein the FSM transitions from the first state to the second state after one clock cycle of the clock signal.

18. The IC of claim 17, wherein the FSM includes a third state in which the FSM reads the first value from the first memory address, wherein the FSM transitions from the second state to the third state after one clock cycle of the clock signal, wherein the FSM includes a fourth state in which the FSM reads the second value from the second memory address, and wherein the FSM transitions from the third state to the fourth state after one clock cycle of the clock signal.

19. The IC of claim 18, wherein the FSM includes a fifth state in which the FSM provides an oscillating signal to a clock input of the memory device, wherein the oscillating signal corresponds to the first oscillations or the second oscillations, wherein the FSM transitions from the fourth state to the fifth state after one clock cycle of the clock signal, and wherein the FSM transitions from the fifth state to the idle state when the enable signal is deasserted.

20. The IC of claim 16, wherein the circuit comprises a clock divider, wherein an oscillating signal corresponding to the first oscillations or the second oscillations is provided as an input to the clock divider, and wherein an output of the clock divider is provided as an output of the circuit.

* * * * *